(12) United States Patent
Wang et al.

(10) Patent No.: US 11,502,622 B2
(45) Date of Patent: Nov. 15, 2022

(54) PIEZOELECTRIC-TRIBOELECTRIC HEEL CHARGER TO GENERATE ELECTRICITY FROM LOCOMOTION USING LEVEL MECHANISM AND MECHANICAL SSHI BOOSTING CIRCUIT

(71) Applicant: The Research Foundation for The State University of New York, Albany, NY (US)

(72) Inventors: Ya Wang, Nesconset, NY (US); Haili Liu, Stony Brook, NY (US)

(73) Assignee: The Research Foundation for The State University of New York, Albany, NY (US)

(*) Notice: Subject to any disclaimer, the term of this patent is extended or adjusted under 35 U.S.C. 154(b) by 501 days.

(21) Appl. No.: 16/678,498

(22) Filed: Nov. 8, 2019

(65) Prior Publication Data
US 2020/0177105 A1 Jun. 4, 2020

Related U.S. Application Data

(60) Provisional application No. 62/757,398, filed on Nov. 8, 2018.

(51) Int. Cl.
*H01L 41/113* (2006.01)
*H02N 2/18* (2006.01)
(Continued)

(52) U.S. Cl.
CPC ............... *H02N 1/04* (2013.01); *A43B 3/38* (2022.01); *A43B 17/16* (2013.01);
(Continued)

(58) Field of Classification Search
CPC ............... H01L 41/113; H01L 41/1132; H01L 41/1134; H01L 41/1136; H01L 41/1138;
(Continued)

(56) References Cited

U.S. PATENT DOCUMENTS 3,143,388 A 8/1964 Mahoney, Jr. et al.
5,678,327 A 10/1997 Halberstadt
(Continued)

FOREIGN PATENT DOCUMENTS

CN 1599872 A 3/2005
CN 203897403 U 10/2014
(Continued)

OTHER PUBLICATIONS

Huang T. et al., "Human Walking-Driven Wearable All-Fiber Triboelectric Nanogenerator Containing Electrospun Polyvinylidene Fluoride Piezoelectric Nanofibers", Nano Energy 14:226-235 (2015).
(Continued)

*Primary Examiner* — Derek J Rosenau
(74) *Attorney, Agent, or Firm* — Scully, Scott, Murphy & Presser, P.C.

(57) ABSTRACT

The disclosure provides an electricity generating insert for a piece of footwear, the insert can be removably placed in the heel portion, e.g. under the insole. The insert comprises a multilayer piezoelectric stack that alternatively flexes under the compression-decompression that occurs during locomotion, which flexing causes friction in the stack to generate electricity capable of charging electronic devices and the like, e.g. via a port on the footwear.

17 Claims, 7 Drawing Sheets

(51) Int. Cl.
  *H02N 1/04* (2006.01)
  *H01L 41/083* (2006.01)
  *H01L 41/187* (2006.01)
  *H01L 41/047* (2006.01)
  *H02J 7/00* (2006.01)
  *A43B 17/16* (2006.01)
  *H01L 41/053* (2006.01)
  *A43B 3/38* (2022.01)

(52) U.S. Cl.
  CPC ........ *H01L 41/0477* (2013.01); *H01L 41/053* (2013.01); *H01L 41/083* (2013.01); *H01L 41/1136* (2013.01); *H01L 41/1875* (2013.01); *H02J 7/007* (2013.01); *H02N 2/18* (2013.01); *H02J 2207/20* (2020.01)

(58) Field of Classification Search
  CPC . H01L 41/0477; H01L 41/053; H01L 41/183; H02N 2/18; H02N 2/181; H02N 2/183; H02N 2/185; H02N 1/186; H02N 2/188
  USPC .......................................................... 310/339
  See application file for complete search history.

(56) References Cited

U.S. PATENT DOCUMENTS

| | | | |
|---|---|---|---|
| 6,281,594 B1 | 8/2001 | Sarich | |
| 7,913,422 B1 | 3/2011 | Perenich | |
| 8,353,968 B2 | 1/2013 | King et al. | |
| 9,228,859 B2 | 1/2016 | Ranky et al. | |
| 9,351,900 B2 | 5/2016 | Walsh et al. | |
| 9,572,395 B2 | 2/2017 | Roser | |
| 9,603,416 B1 | 3/2017 | Walsh et al. | |
| 9,609,911 B1 | 4/2017 | Walsh et al. | |
| 9,610,188 B2 | 4/2017 | Walsh | |
| 10,470,518 B1 | 11/2019 | Walsh et al. | |
| 10,959,484 B1 | 3/2021 | Tarlton | |
| 11,278,235 B2 | 3/2022 | Herr et al. | |
| 2006/0021261 A1* | 2/2006 | Face | A43B 13/00 36/132 |
| 2012/0104761 A1 | 5/2012 | Vamvas | |
| 2017/0043488 A1 | 2/2017 | Rennex | |
| 2017/0133953 A1 | 5/2017 | Gross et al. | |
| 2021/0236870 A1 | 8/2021 | Bergengren | |

FOREIGN PATENT DOCUMENTS

| | | |
|---|---|---|
| CN | 107889452 A | 4/2018 |
| CN | 108324230 A | 7/2018 |
| EP | 0754624 B1 | 10/2001 |
| EP | 3003231 B1 | 9/2019 |
| JP | 2003526213 A | 9/2003 |
| KR | 10-2016-0112587 A | 9/2016 |
| WO | 2015088863 A2 | 6/2015 |

OTHER PUBLICATIONS

Roundy S. et al., "A Piezoelectric Vibration Based Generator for Wireless Electronics", Smart Materials and Structures 13:1131-1142 (2004).

Zhao J. et al., "A Shoe-Embedded Piezoelectric Energy Harvester for Wearable Sensors", Sensors 14:12497-12510 (2014).

* cited by examiner

PIEZOELECTRIC-TRIBOELECTRIC HEEL CHARGER TO GENERATE ELECTRICITY FROM LOCOMOTION USING LEVEL MECHANISM AND MECHANICAL SSHI BOOSTING CIRCUIT

CLAIM OF PRIORITY

This application claims priority to U.S. Provisional Application Ser. No. 62/757,398, filed Nov. 8, 2018, the entire contents of which are incorporated herein by reference.

GOVERNMENT SUPPORT STATEMENT

This invention was made with government support under contract number 1116206 awarded by the Office of Naval Research and contract number AR0000531 awarded by the Department of Energy. The government has certain rights in the invention.

BACKGROUND OF THE DISCLOSURE

Running out of battery power often could be life-threatening for emergency first responders, soldiers, hikers or mountaineers, etc. Backup batteries are large, heavy, hazardous, and sometimes unreliable. For example, U.S. Marines typically carry 16-20 lbs of batteries for a 72-hour mission (1000 Wh/kg, U.S. Office of Naval Research code 30). Portable solar panels and hand-cranked generators can be effective, but add significant weight and space requirements and need certain time or operation to perform the charging process.

The increasing usage of mobile and/or wearable electronic devices extends the capabilities of the human being but also creates growing demands for sustainable power supplies. The stagnation of chemical battery technologies, along with their various hazards, calls for alternative solutions. Harvesting otherwise wasted energy from human locomotion is one promising approach. Human footsteps are a great source of power; a healthy person with a weight of 68 kg is expected to walk 10,000 steps a day and potentially produces the equivalent of 5.6 kW·h of electricity at a conservative calculation. [Ref: Starner, T. and J. A. Paradiso, Human generated power for mobile electronics. Low power electronics design, 2004. 45: p. 1-35]. Various different mechanisms to take advantage of this untapped energy, including electromagnetic induction systems [Ref: Hayashida, J. Y., Unobtrusive integration of magnetic generator systems into common footwear. 2000, MIT Media Lab], the piezoelectric effect [Ref: Wang, Y., W. Chen, and P. Guzman, Piezoelectric stack energy harvesting with a force amplification frame: Modeling and experiment. Journal of Intelligent Material Systems and Structures, 2016], the triboelectric effect [Ref: Jung, W.-S., et al., High Output Piezo/Triboelectric Hybrid Generator. Scientific Reports, 2015. 5: p. 9309], reverse electrowetting [Ref: Hsu, T.-H., et al., Bubbler: A Novel Ultra-High Power Density Energy Harvesting Method Based on Reverse Electrowetting. Scientific reports, 2015. 5], etc., were researched, but individually, these technologies lead to bulky mechanisms, poor integration into shoes, or the need for large pedal length causing extra effort and making the use of the device like walking in sand. Furthermore, the output power and power density were problematically low.

There is thus a need for a more effective electrical generating device for footwear that is also conveniently sized, lightweight, and optionally removable.

SUMMARY OF THE DISCLOSURE

In one aspect, the disclosure relates to a heel insert for generating electricity in a piece of footwear during human locomotion, e.g. without limitation, walking, jogging, trotting, running, jumping, and any other activity involving a heel strike on a surface. In one embodiment: the heel insert comprises a housing configured for insertion into the heel portion of a piece of footwear, e.g. under the insole, the housing having a top, a bottom, a back end and a front end opposite the back end, and a lever component disposed with the housing. The lever component comprises: a spring, e.g. a coil spring, having a first end and a second end, the first end connected to the top of the housing proximate the back end; a short arm having one end attached to the second end of the spring and the other end attached to a pivot point; and a long arm having one end attached to the pivot point and the other end fixed to the top of the housing at the front end, the long arm comprising two or more stacks of composite beams, each beam individually comprising a first metallic layer having a top surface and a bottom surface, a first piezoelectric layer bonded to the top surface of the first metallic layer and a second piezoelectric layer bonded to the bottom surface of the first metallic layer, a polymer-coated metallic electrode layer bonded atop the first piezoelectric layer, and a triboelectric layer bonded atop the surface of the second piezoelectric layer, wherein during human locomotion (i) compression of the spring rotates the short arm about the pivot point to flex the stacks into a concave shape relative to the top of the housing and (ii) decompression of the spring rotates the short arm about the pivot point in a direction opposite that in (i) to flex the stacks into a convex shape relative to the top of the housing, wherein the flexing (i) and (ii) causes friction between the composite beams sufficient to generate electricity.

The description herein is made with reference to the Figures for purposes of convenience only; it is exemplary and not restrictive of the disclosure.

Figure 1A:
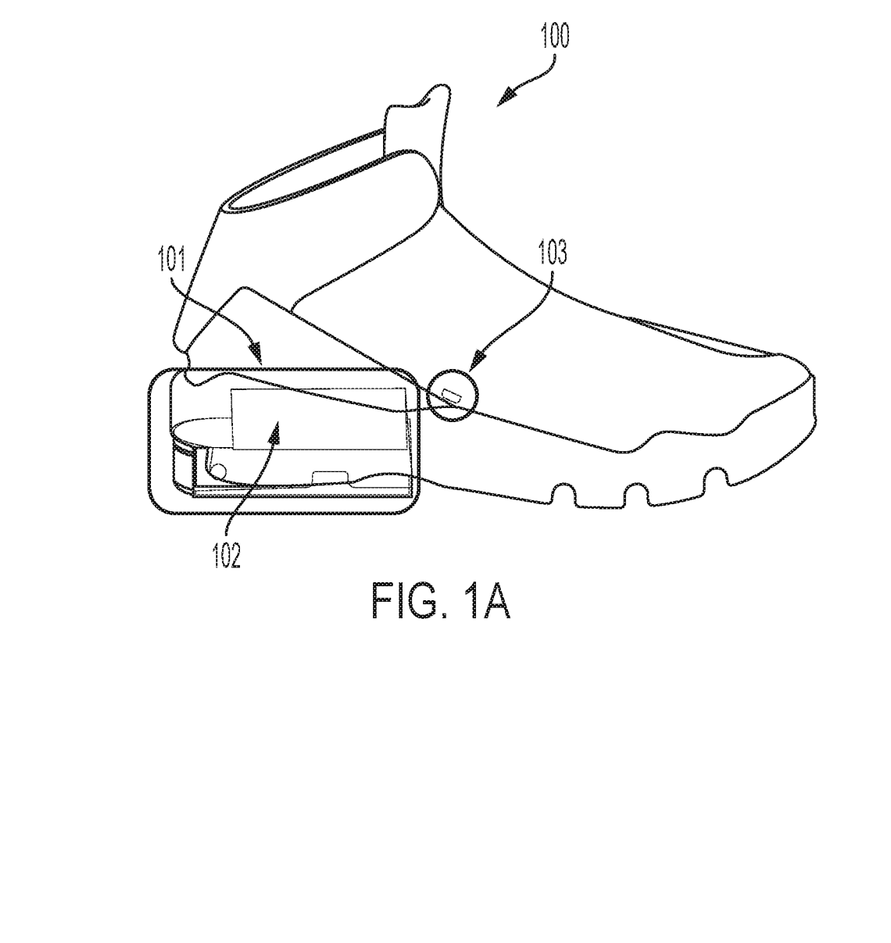
FIG. 1A is a side view of an embodiment of the disclosure showing the heel charger insert integrated into a shoe, the shoe having an easy access USB port to receive electricity generated by the heel charger insert.
Figure 1B:
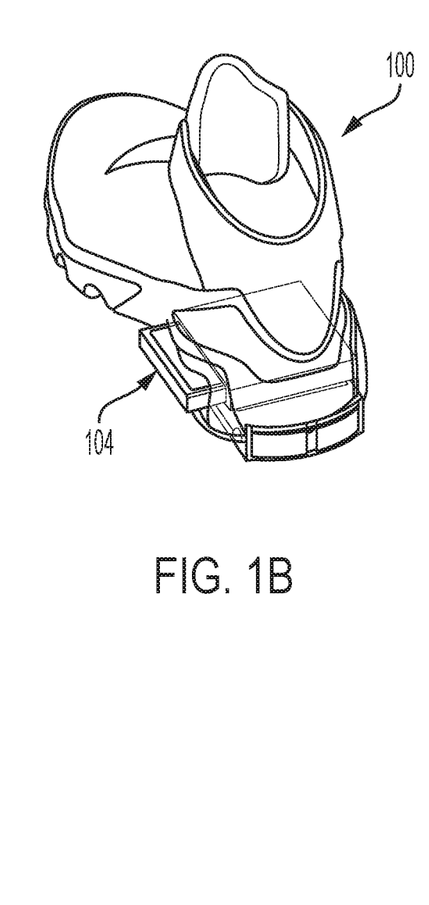
FIG. 1B is a perspective view of the shoe of FIG. 1A having a detachable rechargeable battery that receives electricity generated by the heel charger insert.

As further described herein, embodiments of the invention provide a high power density piezoelectric-triboelectric heel charger that includes a lever amplifier and a boosting mechatronic conditioning circuit to enhance the efficiency, converting motion energy during human walking into electrical energy. Referring to FIGS. 1A and 1B, thereat is depicted a piece of footwear 100. Footwear includes all coverings for feet, such as without limitation, shoes, boots, sneakers, and the like. Footwear 100 has heel portion generally shown at 101 where the heel charger 102 of the disclosure is inserted. The heel portion for insertion can be under the insole, on the insole, an indent at that portion of the sole, or a cavity which can contain the charger. In one practice, the heel charger insert is removable from the footwear; in another, it can be integrated with the footwear, e.g. permanently installed. FIG. 1A shows the presence of an optional charging port 103, e.g. a USB port, easily accessible from the outside of the shoe although port placement can be anywhere on the footwear. The port 103 can be used to charge various electronic devices such as without limitation, personal devices such as cell phones, laptops and the like. FIG. 1B shows a practice whereby a datable detachable rechargeable battery 104 is charged by the electrical power generated by the heel charger insert.

Figure 2A:
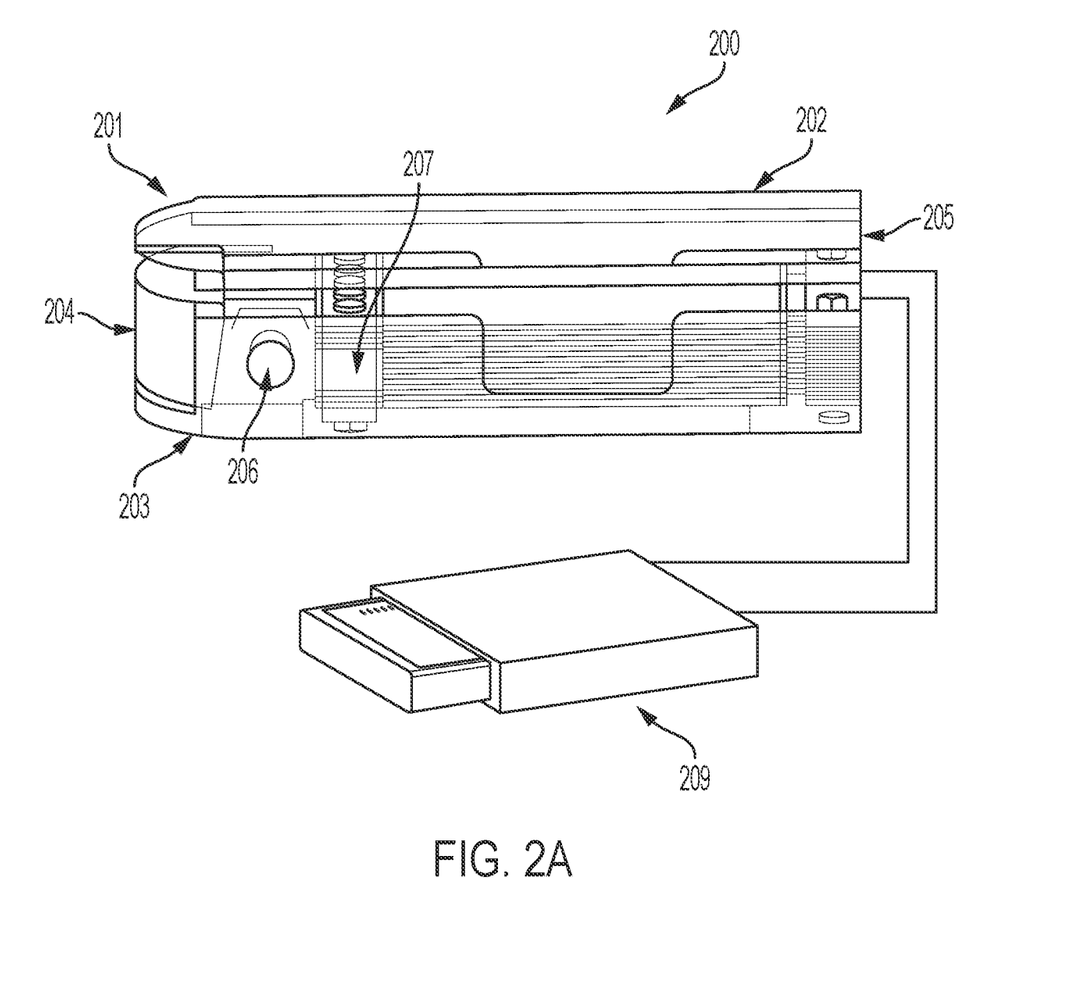
FIG. 2A illustrates a schematic diagram of the mechanical part of the energy harvester.
Figure 2B:
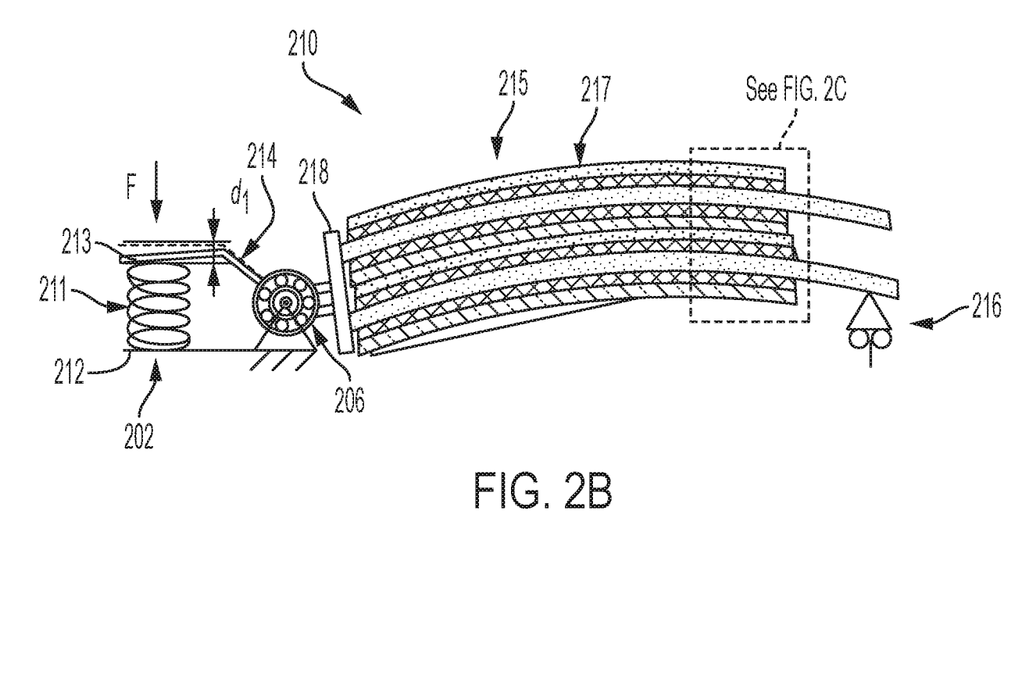
FIG. 2B depicts a partial cross-sectional schematic of an embodiment of the heel charger insert of the disclosure.
Figure 2C:
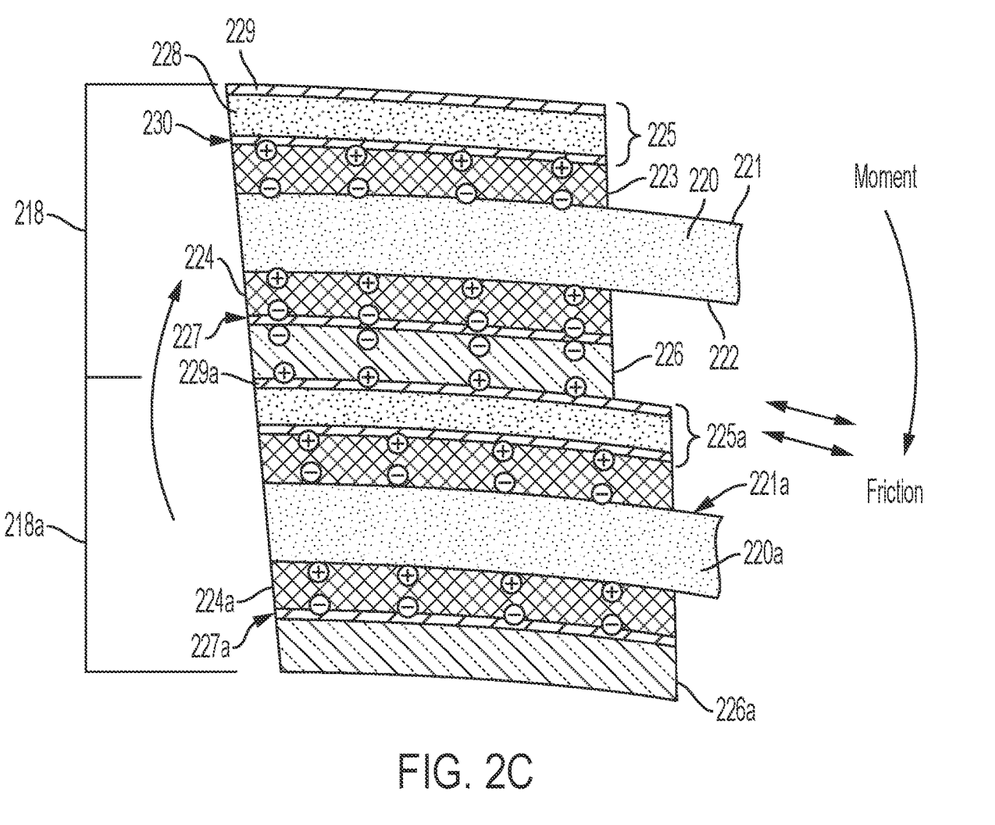
FIG. 2C depicts an enlarged portion of the broken-line square portion of FIG. 2B.

In one embodiment, the high-power density heel insert charger includes a mechanical part and an electrical part. The mechanical part produces AC electrical energy from human locomotion, e.g. walking. The electrical part converts the generated AC power into direct current (DC) power, and supply stable DC voltage source for charging portable devices. Generally, the mechanical part includes multiple sets of composite beams, as shown in FIGS. 2A and 2B, with an associated conditioning circuit and the energy storage component. FIG. 2C illustrates the two stacks of composite beams. Generally, each set of the composite beam includes a copper conductive layer bonded by two piezoelectric patches to each bending side. Since the triboelectric potential materials produce electricity through the rubbing of the contact surfaces of two interface layers made of different materials, a triboelectric layer of PTFE is applied on one bending surface of each composite beam and the PET-coated Ag electrode layer on the bending side of the other composite beam in the pair. Those composite beam sets are clamped to a pivot at one end and pined on the other, as shown in FIG. 2B. The integrated beam acts as a lever arm to amplify the deflection of input walking force.

Turning to FIG. 2A and FIG. 2B (a schematic, not to scale), thereat are illustrated an embodiment of the heel charger insert 200 of the disclosure. In the practice shown, the heel charger insert 200 comprises a housing generally at 201 which is sized for insertion within the heel portion of a piece of footwear. The housing 201 has a bottom 203, a back end 204 and a front end 205. For insertion, the back end 204 is proximate the back of the heel in the piece of footwear. The housing has top 202, which is sufficiently deflectable by material of construction and thickness so as be able to compress the spring 211 during human locomotion, e.g. by heel strike during footfall during walking, yet sufficiently rigid so as not to substantially interfere with the movement of the long arm 215 of lever component 210 as discussed herein. In one practice, a rechargeable super-capacitor 209 is connected to the heel charger insert 200. Suitable materials of construction for the housing include, without limitation, plastics, such as thermoplastics, e.g. acrylonitrile butadiene styrene (ABS), polylactic acid (PLA) and the like.

Referring to FIGS. 2B and 2C, the lever component generally at 210 is disposed within housing 200 and comprises a spring 211, located proximate the back end 204 of housing 200, which spring can be a coil spring or other suitable spring as known in the art, and which has a first end 212 connected to the top 202 of housing 200. The lever component 210 further comprises a rigid short arm portion 214 which can be at an obtuse angle as shown to amplify the displace caused by footfalls during locomotion, the short arm having one end attached to the second end 213 of spring 211 and the other end rotatably attached to pivot pin 206. In the embodiment shown, the long arm portion 217 of lever component 215 comprises two or more composite stack beams, shown in FIG. 2C as 218 and 218a. Although two stacks are depicted, additional stacks may be employed. The following discussion is directed to stack 218 although it will be understood that it applies to stack 218a whose number matches stack 218 with the addition of the suffix "a". Composite beam 218 comprises a first metallic layer 220 which can comprise copper, which includes copper alloys such as brass. First metallic layer 220 has a top surface 221 and a bottom surface 222. A first piezoelectric layer 223 is in contact with the top surface 221 and a second piezoelectric layer 224 in contact with the bottom surface 222. The first and second piezoelectric layers can different or preferably the same, and can be comprised of any piezoelectric materials known in the art, e.g. without limitation those comprised of lead magnesium niobate-lead titanate (PMN-PT).

A polymer-coated metallic electrode layer 225 is atop and in contact with first piezoelectric layer 223. As depicted, this electrode layer 225 has a polymer center 228 which can comprise a thermoplastic, e.g. polyethylene terephthalate (PET) and is coated with a metal such as silver or copper. A triboelectric layer 226 is atop and in contact with the second pizeoelectric layer 224. The triboelectric layer 226 can be comprised of any triboelectric materials known in the art, e.g. without limitation those comprising a fluoropolymer, e.g. a Teflon, e.g. a fluoropolymer comprising polytetrafluoroethylene (PTFE). Optionally, a second metallic layer 227 can be interposed between and in contact with both the triboelectric layer 226 and the second pizeoelectric layer 224; the second metallic layer 227 can a metal comprising silver or copper. The contact between the layers of the composite beam 218 comprised of 221, 223, 225, 224, 226, 227, and the layers of composite beam 218a comprised of 221a, 223a, 225a, 224a, 226a, 227, and the contact between composite beams 218 and 218a is a mechanical contact, e.g. a press fit provided e.g. by clamp 207 (FIG. 2A). In the embodiment shown, long lever arm 217 comprised of the stacks of composite beams 218 and 218a has one end rotatably connected to pivot pin 206.

As depicted, long arm 217 has one end fixed to the top of the housing generally shown schematically along point 216 and with the other end connected to pivot pin 206, which connection can be via composite beams 218 and 218a which can be held to member 218 via clamp 207 or otherwise attached. Suitable materials of construction for the short arm 214 and long arm 217 can include, without limitation, plastics, such as thermoplastics, e.g., polylactic acid (PLA) and the like. In one practice, these can be manufactured by 3D printing. Dimensions of the component parts of the heel charger insert can vary so long as they accommodate the heel portion of a piece of footwear. Without limitations, exemplary dimensions and materials of construction include composite beams that are about 50×50×0.2 mm, wherein in one practice the pizeoelectric layers, the triboelectic layer, polymer-coated metallic electrode layer, and any interposed second metallic layer are in a first practice about 50×50×0.2 mm, and in a second practice can be 70×53×0.2 mm, and in a third practice the piezoelectric layers, the triboelectric layer, the polymer-coated metallic electrode layer and any interposed second metallic layer are about 50×50×0.2 mm and the first metallic layer is about 70×53×0.2 mm.

Generally, during locomotion, compression of the spring 211 rotates the short arm 214 about the pivot pin 206, the displacement shown by dl in FIG. 2b and the compressive force by arrow F when the heel of the shoe meets the ground, to flex the stacks into a concave shape relative to the top of the housing and (ii) decompression of the spring rotates the short arm about the pivot pin in a direction opposite to that in (i) to flex the stacks into a convex shape relative to the top of the housing, wherein the flexing (i) and (ii) causes friction between the composite beams sufficient to generate electricity. This flexing (i) and (ii) is shown by the up and down curved arrows designated as "Moment" in FIG. 2C. The friction that is thus caused between the composite beams is shown by the juxtaposed side-by-side arrows designated as "Friction."

Figure 3A:
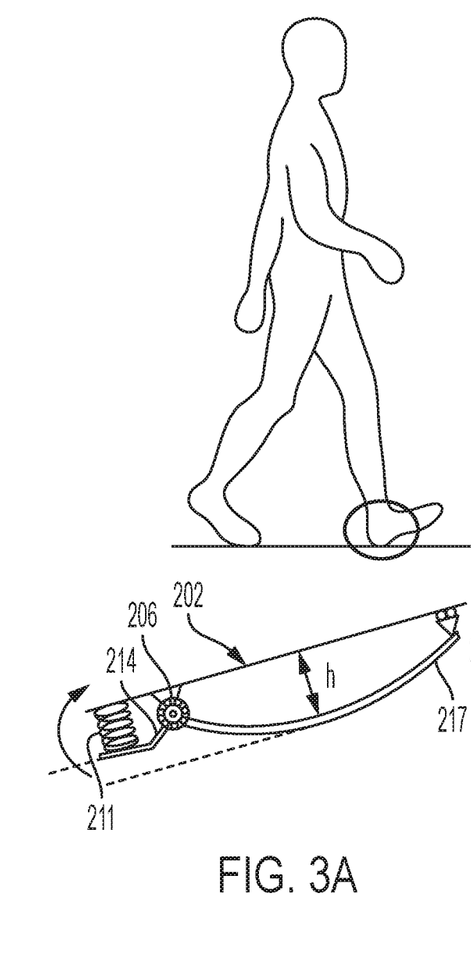
FIGS. 3A, 3B, and 3C illustrate the three working stages of the lever component of the heel charger insert in a left shoe as a user walks.
Figure 3B:
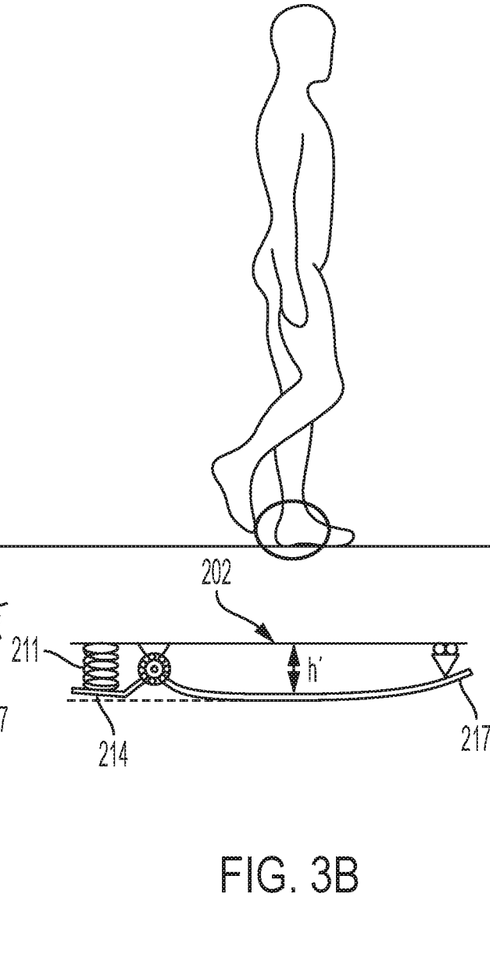

Operationally in this regard, an embodiment of the heel insert charger is described with reference to FIG. 3, which shows an embodiment of three working stages of the lever component illustrating the heel charger insert in a left piece of footwear during each walking stride, where the composite beams are simplified to a cantilevered-pinned beam for ease of illustration. The heel charger insert is inserted into the heel portion of a shoe with the lever component targeting the ground, so that the lever component can level with the ground when walking. The spring is used for restoring the lever component to its initial position. In the practice illustrated in FIG. 3A, when the heel strikes on the ground, the short arm 214 of the lever and the spring 211 are compressed and rotated at a certain angle and the composite beam sets. During this striking, the composite beams 217 are bended to a concave shape relative to the top 202 of the housing, with its middle point, shown by "h" in FIG. 3A, higher than the short arm 214 of the lever, this height differential shown by the dotted lines. At the second stage of the walking, as shown in FIG. 3B, when the shoe is substantially flat to the ground, the composite beams 217 are squeezed to have the same height, shown by h' and the dotted lines in FIG. 3B, with the short arm 214 of the lever.

Figure 3C:
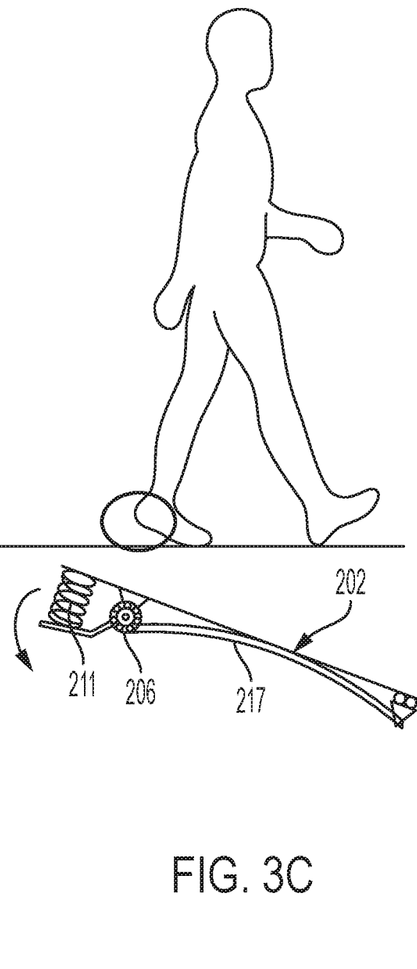

In FIG. 3C, the left heel is raised, and the short arm of the level rotates away from the heel as the under the restoring force of the spring as it is decompressed, and thus the composite beams are bended to a convex shape relative to the top of the housing. During this locomotive process, the composite beams are flexed in alternating concave, squeezed, and convex positions. This displacement deformation is amplified and the friction between two adjacent layers is enhanced, and thus the conversion efficiency is improved.

During locomotion, compression of the spring 211 rotates the short arm 214 about the pivot pin 206 to flex the stacks into a concave shape relative to the top of the housing and (ii) decompression of the spring rotates the short arm about the pivot pin in a direction opposite to that in (i) to flex the stacks into a convex shape relative to the top of the housing, wherein the flexing (i) and (ii) causes friction between the composite beams sufficient to generate electricity.

Figure 4A:
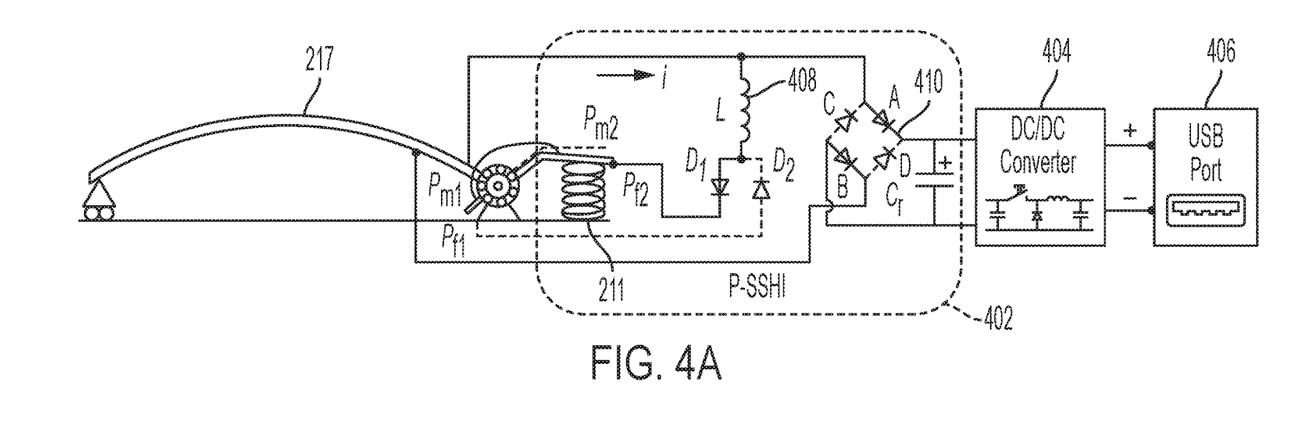
FIG. 4A illustrates an electrical component of the heel charger in one embodiment.
Figure 4B:
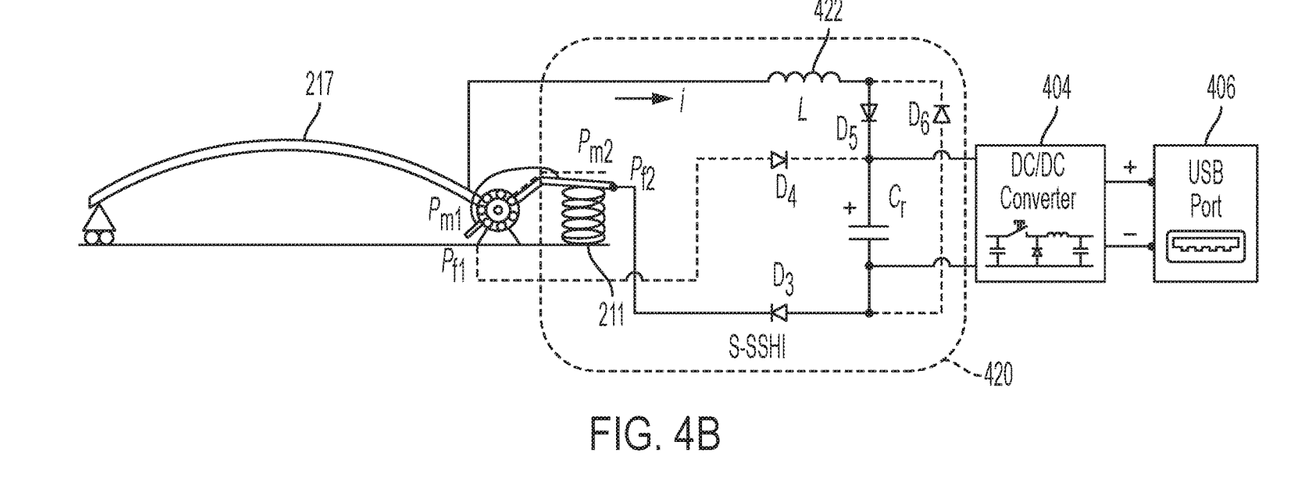
FIG. 4B illustrates the electrical component of the heel charger in another embodiment.

FIGS. 4A-4B illustrates an electrical component of the heel charger in one embodiment. The electrical component or part of the energy harvester can include an AC-DC interface circuit 402 ("circuit 402"), a DC/DC converter 404, a power storage component with a USB port 406. The DC/DC converter 404 can regulate the varying DC power source from the circuit 402 to provide stable voltage to the battery or the USB port 406 which can be used to power devices external to the energy harvester (e.g., a mobile device).

In an example, the circuit 402 can be a high impedance circuit such as synchronized switch harvesting on inductor (SSHI) circuit. SSHI circuits can be suitable for a high impedance power source, and can be capable of increasing the efficiency of energy harvesting by, for example, several hundred percent. The circuit 402 can include a power conditioning circuit portion that detects a maximum deformation of the energy harvester (e.g., flexing of the beams among the long arm 217 and compression of the spring 215) and can form an inductive shortcut for the charge stored in the energy harvesting elements (e.g., the composite beams), such that voltage across the energy harvesting element can be inverted after half of a resonant or RLC cycle.

In some examples, SSHI circuits can carry out these sensing and switching actions by three functional blocks, including a voltage peak detector, a comparator, and an electronic switch. However, some challenges presented by these three functional blocks include lowed open circuit voltage by the non-ideal peak detector; a switching delay is introduced by the non-ideal comparator; and a relatively large threshold voltage can be set by the non-ideal switch. The circuit 402 presented herein can detect deformation of the composite beams and compression of the spring, and use these detected deformation and compression as a mechanical switch for the SSHI circuit (or the circuit 402). Thus, the disclosed heel charger includes a mechanical SSHI (M-SSHI) solution that eliminates some electronic components used in conventional self-powered SSHI.

As shown in FIG. 4A, a fixed pole $P_{f1}$ is situated between the pivot pin 206 and a base or frame of the energy harvester. A moving pole $P_{m1}$ has one end attached to the pivot pin 206, and the other end of $P_{m1}$ is free moving. In other words, as pivot pin 206 turns, the moving pole $P_{m1}$ can rotate about a center of the pivot pin 206. Also shown in FIG. 4A, a fixed pole $P_{f2}$ is situated across a top surface of the spring 211, and a moving pole $P_{m2}$ has one end attached to the pivot pin 206, and the other end of $P_{m2}$ is free moving. In other words, as pivot pin 206 turns, the moving pole $P_{m2}$ can rotate about a center of the pivot pin 206. Note that the moving poles $P_{m1}$ and $P_{m2}$ are positioned such that they will not contact each other. Further, $P_{f2}$ can be fixed on the stopper (shown in FIG. 4C) which is used to confine the maximum displacement of the lever beam.

During locomotion, the pivot pin 206 will turn and the moving poles $P_{m1}$ and $P_{m2}$ will rotate according to the spin direction of the pivot pin 206. For example, when the pivot pin 206 turns in the clockwise direction, the moving pole $P_{m2}$ can move downward towards the fixed pole $P_{f2}$, until the moving pole $P_{m2}$ contacts the fixed pole $P_{f2}$, and the moving pole $P_{m1}$ can move away from the fixed pole $P_{f1}$. Similarly, when the pivot pin 206 turns in the counter-clockwise direction, the moving pole $P_{m2}$ can away from the fixed pole $P_{f2}$, the moving pole $P_{m1}$ can towards the fixed pole $P_{f1}$, until the moving pole $P_{m1}$ contacts the fixed pole $P_{f1}$. By using these direct mechanical contact between the moving poles and the fixed poles, the moving poles and fixed poles can operate as a mechanical switch for the circuit 402.

In FIG. 4A, the mechanical switch (e.g., the moving and fixed poles) are connected to the circuit 402 in parallel with a bridge rectifier 410 to form a parallel SSHI (P-SSHI). The bridge rectifier 410 can include four diodes, labeled as A, B, C, D. The circuit 402 can include an inductor 408 (labeled as L), a diode $D_1$, a diode $D_2$, and a capacitor $C_r$. When the moving pole $P_{m2}$ contacts the fixed pole $P_{f2}$, a first closed circuit is formed, where the first closed circuit conducts the inductor 408, the diode $D_1$, the moving pole $P_{m2}$, the fixed pole $P_{f2}$, $C_r$, and diodes A, B of the bridge rectifier 410. When the moving pole $P_{m1}$ contacts the fixed pole $P_{f1}$, a second closed circuit is formed (see dotted lines), where the second closed circuit conducts the inductor 408, the diode $D_2$, the moving pole $P_{m1}$, the fixed pole $P_{f1}$, $C_r$, and diodes C, D of the bridge rectifier 410. Note that the first and second closed circuits in FIG. 4A cannot be formed simultaneously. The sequential formation of the first and second closed circuits in FIG. 4A can cause the voltage across the composite beams in the long arm 217 to be inverted in half a resonant cycle.

In another embodiment shown in FIG. 4B, the mechanical switch (e.g., the moving and fixed poles) are connected to a circuit 420 (which can also be a SSHI circuit) in series with an inductor 422, forming a series SSHI (S-SSHI). The circuit 420 can include an inductor 422 (labeled as L), a diode $D_3$, a diode $D_4$, a diode $D_5$, a diode $D_6$, and a capacitor $C_r$. When the moving pole $P_{m2}$ contacts the fixed pole $P_{f2}$, a first closed circuit is formed, where the first closed circuit conducts the inductor 422, the diode $D_5$, $C_r$, the diode $D_3$, the moving pole $P_{m2}$, and the fixed pole $P_{f2}$. When the moving pole $P_{m1}$ contacts the fixed pole $P_{f1}$, a second closed circuit is formed (see dotted lines), where the second closed circuit conducts the inductor 422, the diode $D_6$, the moving pole $P_{m1}$, the fixed pole $P_{f1}$, the diodes $D_4$, and $C_r$. Note that the first and second closed circuits in FIG. 4B cannot be formed simultaneously. The sequential formation of the first and second closed circuits in FIG. 4B can cause the voltage across the composite beams in the long arm 217 to be inverted in half a resonant cycle.

Note that in FIG. 4B, the S-SSHI (circuit 420) connects the inductor 422 in series with diodes $D_3$, $D_4$, $D_5$, $D_6$, which collectively can be a rectifier. Noting that the rectifier includes four diodes and can perform similar functions as that of D1/D2 in the P-SSHI (circuit 402), the block diodes can be eliminated and only two diodes are actively used at the same time. Thus, both P-SSHI and S-SSHI eliminate some diodes and transistors, which will not only cut down the cost, but more importantly, significantly reduce energy loss, maintain the higher voltage, and increase the energy harvesting efficiency.

Figure 4C:
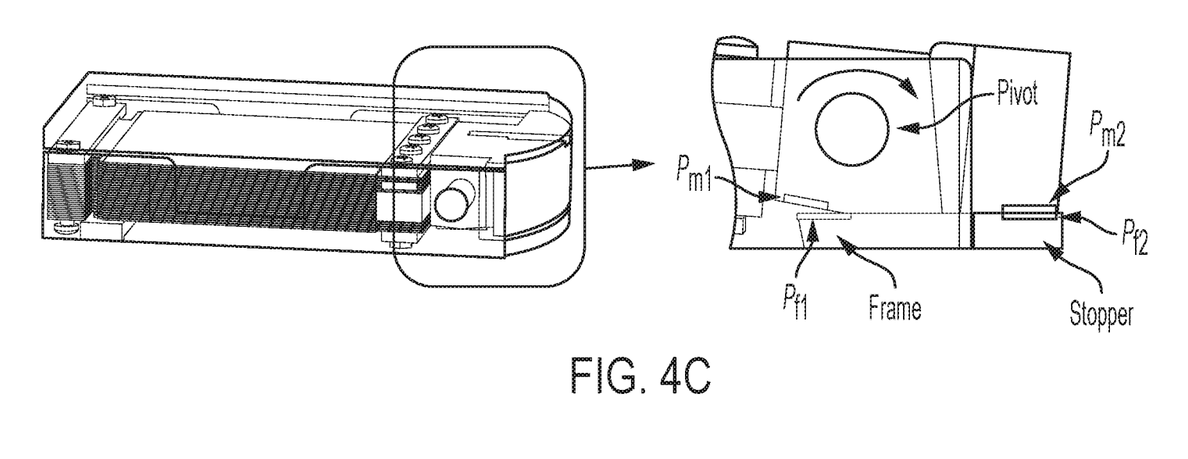
FIG. 4C illustrates a cross-sectional view of the heel charger in one embodiment.

FIG. 4C illustrates a cross-sectional view of the heel charger in one embodiment. As shown in FIG. 4C, the fixed pole $P_{f2}$ is situated on top of the stopper, and the moving pole $P_{m2}$ can contact the fixed pole $P_{f2}$ while the moving pole $P_{m1}$ does not contact the fixed pole $P_{f1}$.

Figure 4D:
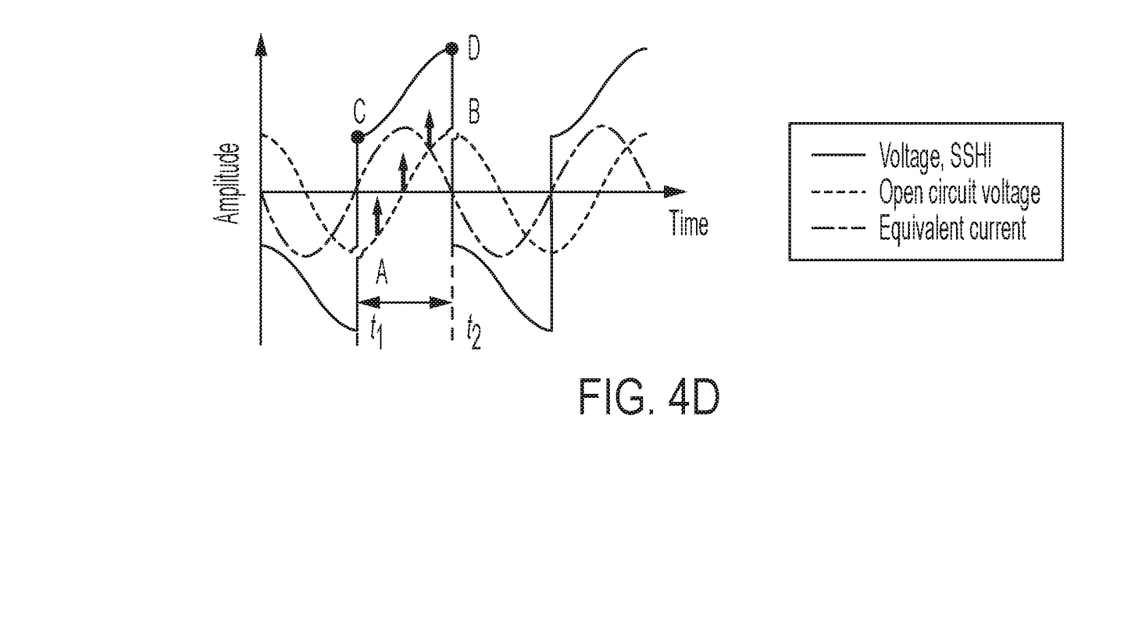
FIG. 4D illustrates example results from an operation of the electrical component of the heel charger in one embodiment.

FIG. 4D illustrates example results from an operation of the electrical component of the heel charger in one embodiment. In FIG. 4D, the solid line represents the voltage waveforms when the M-SSHI circuit (e.g., circuits 402, 420) is connected; the dash line represents the open circuit voltage; the dash dot line indicates the equivalent current across the piezoelectric/triboelectric element. Taking the time period of t1-t2 as an example, at the time instant t1, the short arm of the level reach the stopper, which means the moving pole $P_{m2}$ contacts the fixed pole $P_{f2}$; the open voltage reaches its maximum and the current come across zero. At this time instant, the switch is turn on, and thus the circuit branch of L-$D_1$-$P_{f2}$-$P_{m2}$ conducts, which forms a RLC resonant circuit (e.g., first closed circuit in FIG. 4A). With the RLC resonant circuit, the voltage across the piezoelectric/triboelectric elements will be inverted in half of the resonant cycle, while the current cannot flow back due to the diode $D_1$, and thus the voltage across the piezoelectric/triboelectric elements is inverted to point C and will continue to increase to point D when the short arm of the level moving towards the opposite direction and $P_{m1}$ runs towards $P_{f1}$. If no loss happens in this cycle, the waveform shape of C-D would be the same with that of A-B, while the voltage value is enhanced greatly and this will boost the energy harvesting efficiency.

It is noted that, the circuit branch with the dotted line (open circuit voltage) always conducts regardless of whether the moving and fixed poles contact or not. When the short arm of the level is released from external force and move away from the heel under the restore force of the spring, the moving pole $P_{m1}$ contacts $P_{f1}$. At the time instance of the mechanical contact, the second closed circuit conducts and the voltage across the piezoelectric/triboelectric elements is inverted. The process repeats every cycle with the lever beam running periodically.

Apart from the above configurations, the heel charger insert may be configured to simplify the design. For example, the triboelectric elements or the piezoelectric elements may be eliminated in the design, i.e. either the piezoelectric layers or the triboelectric layers themselves can work as a stand-alone heel charger or the level mechanism maintains the same.

COMPARATIVE EXAMPLE

Known energy conversion technologies can be classified into four groups based on the energy conversion mechanism: electromagnetic, piezoelectric, triboelectric and reverse electrowetting, and are summarized and compared in Table 1 where they are compared with an embodiment of the instant disclosure. Among these known energy conversion mechanisms, electromagnetic transduction can produce high power density, i.e. 59 mW was reported in 2000, by the MIT Media Laboratory [Hayashida, J. Y., Unobtrusive integration of magnetic generator systems into common footwear. 2000, MIT Media Lab.]. However, this mechanism usually needs complex and bulky structures, more importantly, the magnetic field may interfere with daily life. The MIT Media Laboratory developed a piezoelectric typed shoe harvester; however, their output power drops significantly to 1.3 mW [Shenck, N. S. and J. A. Paradiso, Energy scavenging with shoe-mounted piezoelectrics. IEEE Micro, 2001. 21(3): p. 30-42.]. More recently in 2015, a reverse electrowetting mechanism was reported for high-power density harvesting cell array with experimentally measured power output of 4.3 µW for a cell of 1 cm by 1 cm [Hsu, T.-H., et al., Bubbler: A Novel Ultra-High Power Density Energy Harvesting Method Based on Reverse Electrowetting. Scientific reports, 2015. 5.]. Their simulation predicts an output power up to 1 W for a 40×40 mm specimen, as reported at http://instepnanopower.com/. SolePower [http://www.solepowertech.com/smartboots/] announced products not yet available through Kickerstarter. Triboelectricity [Jung, W.-S., et al., High Output Piezo/Triboelectric Hybrid Generator. Scientific Reports, 2015. 5: p. 9309.], needs tactful structures to exploit its advantages. Based on the dynamic characteristic of human walking strides, the heel charger described herein takes advantage of both piezoelectric and triboelectric transduction materials to obtain high energy conversion efficiency with an output power reaching up to 60 mW per foot.

| Technology Provenance | Mechanism | Circuit Interface | Input Condition | RMS AC output (mW) | Efficiency | DC output (mW) |
|---|---|---|---|---|---|---|
| MIT Media Laboratory[a] | Piezoelectric (PZT & PVDF) | N/A | Walking @ 1 Hz | PZT: 8.4 PVDF: 1.3 | 15.4% | 1.3 |
| MIT Media Laboratory[b] | Electromagnet | N/A | Walking @ 1 Hz | 59 | N/A | N/A |
| Georgia Tech[c] | Triboelectric | SEH | Stepping @ 4 Hz | ~1.8 | 59.8% | 1.0 |
| Univ. of Wisconsin-Madison[d,e] | reverse electrowetting | SEH | Stepping @ 4 Hz (Estimated) | 0.0043 (10 × 10 mm) | N/A | N/A |
| Current Invention | Piezoelectric and Triboelectric & Triboelectric | N/A | Walking @ 2 Hz | 30 | 80% | 24 |
| Design A[f] | Piezoelectric (lever) | SEH | 241 N force, 2.3 Hz frequency (excited by shaker) | 13.6 mW | 21.8% | 2.97 |
| Design B[f] | Piezoelectric (lever) | M-SSHI | 241 N force, 2.3 Hz frequency (excited by shaker) | 13.6 mW | 45.1% | 6.13 |

[a]Shenck, N. S. and J. A. Paradiso, Energy scavenging with shoe-mounted piezoelectrics. IEEE Micro, 2001. 21(3): p. 30-42.
[b]Hayashida, J. Y., Unobtrusive integration of magnetic generator systems into common footwear. 2000, MIT Media Lab.
[c]Niu, S., et al., A universal self-charging system driven by random biomechanical energy for sustainable operation of mobile electronics. Nature communications, 2015. 6.
[d]Hsu, T. -H., et al., Bubbler: A Novel Ultra-High Power Density Energy Harvesting Method Based on Reverse Electrowetting. Scientific reports, 2015. 5.
[e]http://instepnanopower.com/

In Table 1, the current invention entry employed PMN-PT as first and second piezoelectric layers, PTFE as turboelectric layer, the polymer-coated metallic electrode layer was PET coated with silver, and the second metallic layer was copper.

The advantages of the heel charger insert of the present disclosure include: by providing the high impedance of the piezoelectric/triboelectric elements, a boosting circuit can be integrated into the structure part, which eliminates electronic components by using a mechanical design and increases the efficiency up to 91%. To obtain a stable output voltage, a DC/DC converter can be used, and the total converting efficiency is around 80%. Other advantages include:

- the ability to amplify the displacement of footsteps by the lever component to achieve higher efficiency.
- utilizing the motion of the ankle to increase the squeezing process and thus enhance the deformation and friction, and finally increase the output energy.
- ability to obtain multimodal energy harvesting. Piezoelectric and triboelectric effect are well utilized at the same time, and both are enhanced by large flexing and relative moving.
- the mechanical SSHI technology of the disclosure eliminates electronic components to cut down the material and energy cost and increase the AC-DC converting efficiency up to 91%
- the heel charger insert is easy to use, and can be equipped with USB port or detachable charger
- the heel charger insert provides a clean alternative solution to such problems by powering electronics remotely. With negligible weight, the heel charger described herein provides the electrical energy equivalent needed for six minutes of continuous cell phone usage with just one hour of walking.
- the disclosed heel charger insert can be a detachable device placed under an existing shoe insole. It facilitates user's ability to charge lifesaving electronic devices by harvesting otherwise wasted walking energy. By using a razor thin, flexible, and rechargeable super-capacitor, the heel charger insert turns a shoe into a charging station. Using a levered piezoelectric-triboelectric multimodal mechanism and a mechanical Synchronized Switch Harvesting on Inductor (M-SSHI) conditioning circuit, the stacked composite beams comprising the piezoelectrics produce up to 15 times more energy per step than known products/prototypes. Bluetooth can connect the heel charger insert to a user's mobile devices, providing potentially lifesaving signals. Users can also use the electricity generated to switch on high-visibility LEDs to be seen in the dark.
- The heel charger insert has use with the military and first responders, where continuous and reliable power supplies to their electric devices are critical.
- In addition to powering external devices, the heel charger insert of the disclosure can be used to supply energy to in-shoe sensing, communication, and personal coaching devices (e.g. ARION, Netherlands), allowing them to work without having to externally charge or replace batteries in the shoes.

While the invention has been shown and described with reference to certain embodiments of the present invention thereof, it will be understood by those skilled in the art that various changes in from and details may be made therein without departing from the spirit and scope of the present invention and equivalents thereof.

What is claimed is:

1. A heel charger insert for generating electricity in a piece of footwear during human locomotion comprising:

a housing configured for insertion into a heel portion of a piece of footwear, the housing having a deflectable top, a bottom, a back end and a front end opposite the back end, a lever component disposed with the housing, the lever component comprising:

a spring having a first end and a second end, the first end connected to the top of the housing proximate the back end;

a short arm having one end attached to the second end of the spring and the other end rotatably attached to a pivot pin;

a long arm having one end rotatably connected to the pivot pin and the other end fixed to the top of the housing at the front end, the long arm comprising two or more stacks of composite beams, each beam individually comprising a first metallic layer having a top surface and a bottom surface, a first piezoelectric layer in contact with the top surface of the first metallic layer and a second piezoelectric layer in contact with the bottom surface of the first metallic layer, a polymer-coated metallic electrode layer atop and in contact with the first piezoelectric layer, and a triboelectric layer atop and in contact with the second piezoelectric layer, wherein during human locomotion (i) compression of the spring rotates the short arm about the pivot pin to flex the stacks into a concave shape relative to the top of the housing and (ii) decompression of the spring rotates the short arm about the pivot pin in a direction opposite to that in (i) to flex the stacks into a convex shape relative to the top of the housing, wherein the flexing (i) and (ii) causes friction between the composite beams sufficient to generate electricity.

2. The heel charger insert of claim 1 wherein the middle point of the concave shape is higher than the short arm.

3. The heel charger insert of claim 1 wherein the first metallic layer is comprises a copper alloy.

4. The heel charger insert of claim 1 wherein the first and second piezoelectric layers are the same or different.

5. The heel charger insert of claim 4 wherein the first and second piezoelectric layers are each individually comprised of lead magnesium niobate-lead titanate (PMN-PT).

6. The heel charger insert of claim 1 wherein triboelectric layer comprises a fluoropolymer.

7. The heel charger insert of claim 6 wherein the fluoropolymer comprises polytetrafluoroethylene (PTFE).

8. The heel charger insert of claim 1 wherein the polymer of the polymer-coated metallic electrode layer comprises a thermoplastic and the metal of the metallic electrode comprises silver or copper.

9. The heel charger insert of claim 1 wherein the housing is removable from the heel portion of the piece of footwear.

10. The heel charger insert of claim 1 further comprising a second metallic layer and between the triboelectric layer and the second piezoelectric layer with which the triboelectric layer is in contact.

11. The heel charger insert of claim 10 wherein the second metallic layer comprises silver or copper.

12. The heel charger insert of claim 1 wherein the stacks of composite beams of the long arm are clamped together proximate the pivot pin.

13. The heel charger insert of claim 1 further comprises one or more of an AC-DC interface, a DC/DC converter, an electrical storage component, or a USB port, each individually adapted to receive the electricity generated.

14. The heel charger insert of claim 1 further comprises a mechanical synchronized switch harvesting on inductor (SSHI) circuit, wherein:

the compression of the spring forms a first closed circuit among the mechanical SSHI circuit that inverts voltage across the two or more stacks of composite beams in half of a resonant cycle; and the decompression of the spring forms a second closed circuit among the mechanical SSHI circuit that inverts the voltage across the two or more stacks of composite beams in half of the resonant cycle.

15. The heel charger insert of claim 14, wherein the mechanical SSHI circuit comprises a bridge rectifier connected to an inductor in parallel.

16. The heel charger insert of claim 14, wherein the mechanical SSHI circuit comprises a rectifier connected to an inductor in series.

17. A piece of footwear comprising the heel insert of claim 1.

* * * * *